United States Patent
Bae et al.

(10) Patent No.: US 9,166,605 B2
(45) Date of Patent: Oct. 20, 2015

(54) LOW-POWER AND ALL-DIGITAL PHASE INTERPOLATOR-BASED CLOCK AND DATA RECOVERY ARCHITECTURE

(71) Applicant: Korea Advanced Institute of Science and Technology, Daejeon (KR)

(72) Inventors: Hyeon Min Bae, Seoul (KR); Tae Hun Yoon, Daejeon (KR); Joon Yeong Lee, Daejeon (KR)

(73) Assignee: TeraSquare Co., Ltd., Seoul (KR)

( * ) Notice: Subject to any disclaimer, the term of this patent is extended or adjusted under 35 U.S.C. 154(b) by 284 days.

(21) Appl. No.: 13/846,688

(22) Filed: Mar. 18, 2013

(65) Prior Publication Data

US 2014/0269783 A1    Sep. 18, 2014

(51) Int. Cl.
| | |
|---|---|
| H03L 7/00 | (2006.01) |
| H03L 7/081 | (2006.01) |
| H04J 3/06 | (2006.01) |
| H03L 7/07 | (2006.01) |
| H03L 7/099 | (2006.01) |

(52) U.S. Cl.
CPC *H03L 7/081* (2013.01); *H03L 7/07* (2013.01); *H03L 7/0814* (2013.01); *H03L 7/0998* (2013.01); *H04J 3/06* (2013.01)

(58) Field of Classification Search
None
See application file for complete search history.

(56) References Cited

U.S. PATENT DOCUMENTS

| | | | |
|---|---|---|---|
| 5,970,110 A * | 10/1999 | Li | 377/48 |
| 7,173,462 B1 * | 2/2007 | Wang | 327/158 |
| 8,804,888 B2 * | 8/2014 | Mohajeri et al. | 375/355 |
| 2002/0009170 A1 * | 1/2002 | Schmatz | 375/371 |
| 2002/0159556 A1 * | 10/2002 | Kishine et al. | 375/376 |
| 2003/0189467 A1 * | 10/2003 | Krawczyk et al. | 331/117 R |
| 2004/0218705 A1 | 11/2004 | Cranford, Jr. et al. | |
| 2006/0067453 A1 * | 3/2006 | Duelk | 375/376 |
| 2006/0245531 A1 * | 11/2006 | Leonowich et al. | 375/376 |
| 2007/0047689 A1 * | 3/2007 | Menolfi et al. | 375/376 |
| 2008/0056426 A1 * | 3/2008 | Si et al. | 375/373 |
| 2009/0290672 A1 * | 11/2009 | Ho | 375/374 |
| 2010/0090733 A1 * | 4/2010 | Kristensson et al. | 327/156 |
| 2010/0091927 A1 * | 4/2010 | Walker et al. | 375/374 |
| 2010/0111241 A1 * | 5/2010 | Kesterson et al. | 375/376 |

* cited by examiner

*Primary Examiner* — Robert C Scheibel
(74) *Attorney, Agent, or Firm* — Blakely, Sokoloff, Taylor & Zafman LLP

(57) ABSTRACT

The proposed invention is about an improved method for serial-in and serial-out transceiver applications. The proposed system includes a dual loop phase locked loop (PLL) architecture having a PLL and a phase rotator (PR)-based delay locked loop (DLL). An advantage of this architecture is that a single PLL offers decoupled bandwidths; a wide jitter-tolerance (JTOL) bandwidth for receiving data and a narrow jitter transfer (JTRAN) bandwidth for the data transmission. Thus, the amount of jitter at the output can be substantially reduced relative to the input while offering sufficient jitter tracking bandwidth. Also, this architecture is suitable for low-power applications since a phase shifter in the data path, which is one of the most power-hungry blocks in conventional DPLL designs, is not required.

3 Claims, 8 Drawing Sheets

LOW-POWER AND ALL-DIGITAL PHASE INTERPOLATOR-BASED CLOCK AND DATA RECOVERY ARCHITECTURE

BACKGROUND OF THE INVENTION

1. Field of the Invention

Exemplary embodiments of the present invention relate to a low-power and all-digital phase interpolator (PI)-based clock and data recovery (CDR) architect.

2. Discussion of the Background

A phase-locked loop (PLL) is a control system that generates an output signal whose phase is related to the phase of an input reference signal. The PLL is an electronic circuit consisting of a variable frequency oscillator and a phase detector. The electronic circuit compares the phase of the input signal with the phase of the signal derived from its output oscillator and adjusts the frequency of its oscillator to keep the phases matched. The signal from the phase detector is used to control the oscillator in a feedback loop.

Frequency is the time derivative of phase. Keeping the input and output phase in lock step implies keeping the input and output frequencies in lock step. Consequently, the PLL can track an input frequency, or the PLL can generate a frequency that is a multiple of the input frequency. The former property is used for demodulation, and the latter property is used for indirect frequency synthesis.

A delay-locked loop (DLL) is a digital circuit similar to the PLL, with the main difference being the absence of an internal voltage-controlled oscillator, replaced by a delay line.

A DLL can be used to change the phase of a clock signal (a signal with a periodic waveform), usually to enhance the clock rise-to-data output valid timing characteristics of integrated circuits (such as DRAM devices). The DLLs can also be used for clock recovery (CDR). From the outside, the DLL can be seen as a negative-delay gate placed in the clock path of a digital circuit.

SUMMARY OF THE INVENTION

An exemplary embodiment of the present invention discloses a transceiver, the transceiver comprises a phase rotator (PR)-based delay-locked loop and phase-locked loop (D/PLL) unit configured to generate demultiplexed data samples for input data using multiphase clock signals for sampling the input data and a reference clock signal and a multiplexer configured to serialize the demultiplexed data samples, wherein the multiphase clock signals are generated using a first clock signal, for refining the sampled input data, controlled by the phase-locked loop (PLL) and a second clock signal controlled by the delay-locked loop (DLL).

For the DLL, the PR-based D/PLL unit comprises a plurality of input samplers configured to generate the demultiplexed data samples by time-interleaving using the input data and the multiphase clock signals, a control code generating unit configured to generate a control code for controlling a phase of the second clock signal, a first phase rotator configured to add a phase of the first clock signal to a phase of the second clock signal of which a phase is determined using the control code or subtract the phase of the first clock signal from the phase of the second clock signal and a plurality of phase interpolators (PIs) configured to generate the multiphase clock signals using an output of the first phase rotator.

The control code generating unit comprises a phase decision logic unit configured to generate an up signal or a down signal based on a different between the phase of the second clock signal and a phase of a signal of the input data and a digital loop filter configured to generate the control code using the up signal or the down signal phase and provide the control code to the first phase rotator.

For the PLL, the PR-based D/PLL unit further comprises a digital accumulator (ACC) configured to limit a phase difference between the first clock signal and the second clock signal and a second phase rotator configured to generate the first clock signal of which a phase is shifted using a clock signal outputted from the ACC and the reference clock signal from a frequency-locked loop (FLL).

An exemplary embodiment of the present invention discloses a phase rotator (PR)-based delay-locked loop and phase-locked loop (D/PLL) apparatus comprises a plurality of input samplers configured to generate demultiplexed data samples by time-interleaving using a input data and multiphase clock signals generated for sampling the input data based on a first clock signal and a second clock signal, a control code generating unit configured to generate a control code for controlling a phase of the second clock signal, a first phase rotator configured to add a phase of the first clock signal to a phase of the second clock signal of which a phase is determined using the control code or subtract the phase of the first clock signal from the phase of the second clock signal, a plurality of phase interpolators (PIs) configured to generate the multiphase clock signals using an output of the first phase rotator, a digital accumulator (ACC) configured to limit a phase difference between the first clock signal and the second clock signal and a second phase rotator configured to generate the first clock signal of which a phase is shifted using a clock signal outputted from the ACC and the reference clock signal from a frequency-locked loop (FLL).

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION

Figure 1:
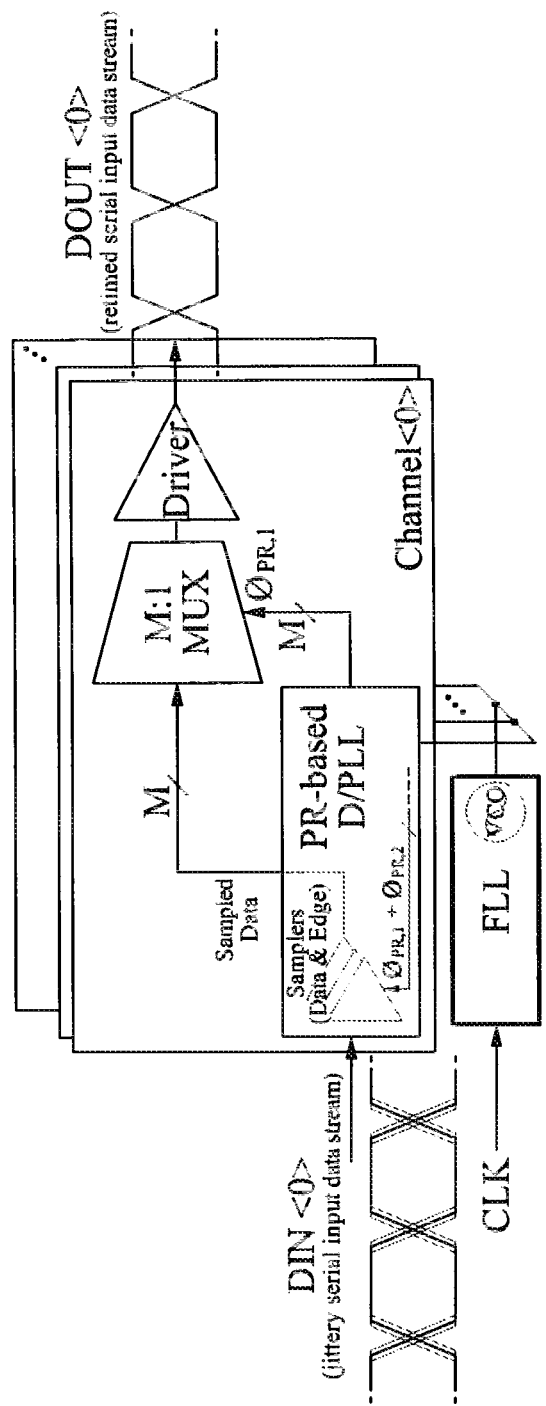
FIG. 1 shows a serial-in and serial-out transceiver architecture according to an exemplary embodiment of the present invention.

The invention is described more fully hereinafter with reference to the accompanying drawings, in which exemplary embodiments of the invention are shown. This invention may, however, be embodied in many different forms and should not be construed as limited to the embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity.

FIG. 1 shows a serial-in and serial-out transceiver architecture according to an exemplary embodiment of the present invention. A voltage-controlled oscillator (VCO) in a frequency-locked loop (FLL) generates a reference clock signal using a external clock (CLK) and distributes the reference clock signal to rotators included in phase rotator (PR)-based D/PLLs, in parallel channels. A transceiver in the paralleled channels may consist of a PR-based D/PLL, a multiplexer (MUX) and a driver. The PR-based D/PLL may generate multiphase clock signals represented using ($\phi_{PR,1}+\phi_{PR,2}$) for sampling of incoming data (Jittery serial input data stream, DIN <0> of Channel <0>) and generate a clock signal represented by ($\phi_{PR,1}$) for retiming of the sampled data. A multiplexer (MUX) serializes demultiplexed data samples created by time-interleaved input samplers (Samplers included in the PR-based D/PLL). The transceiver may generate output data (retimed serial output stream, DOUT <0> of Channel <0>) by reducing a jitter of the incoming data.

Figure 2:
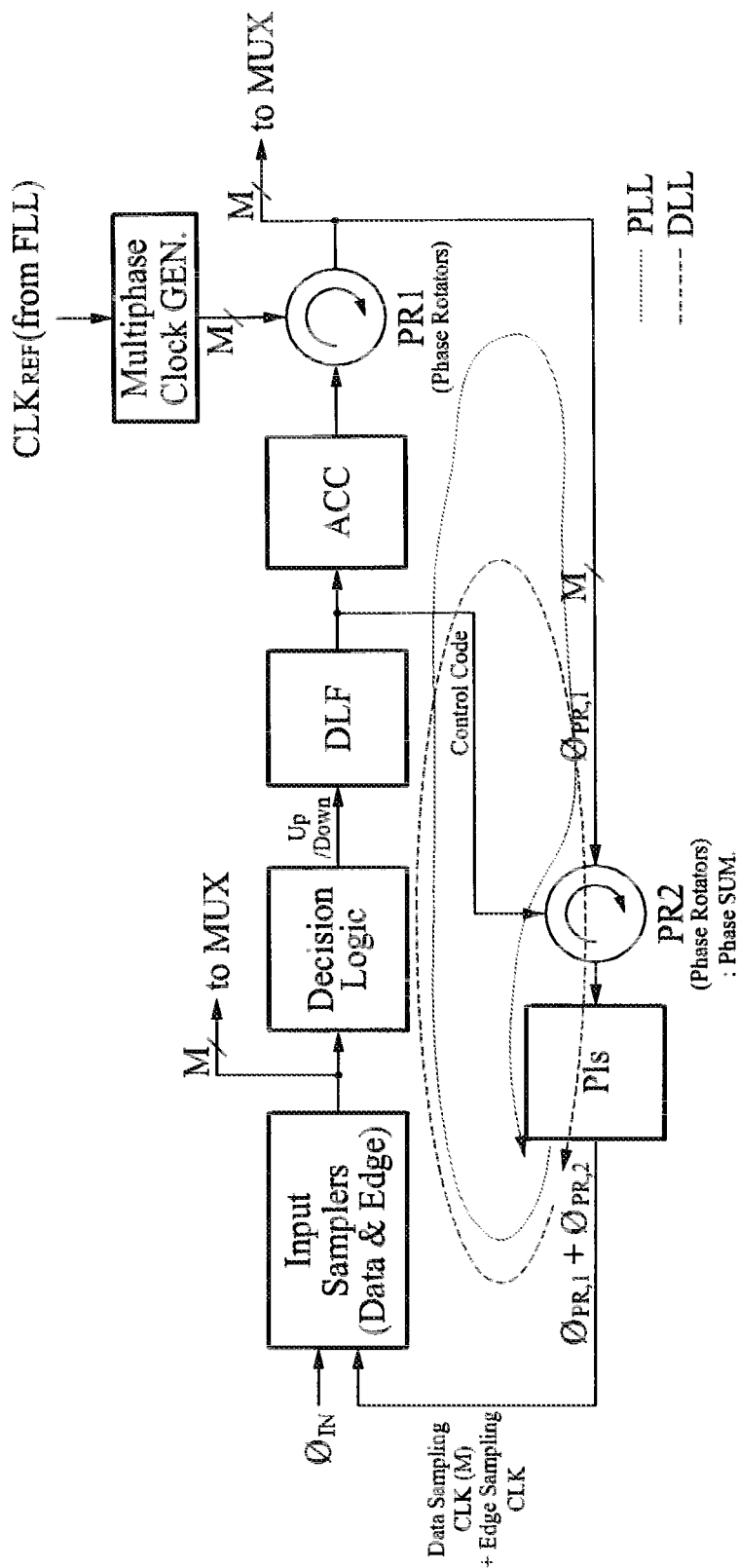
FIG. 2 shows a FR-based D/PLL block diagram according to an exemplary embodiment of the present invention.

FIG. 2 shows a FR-based D/PLL block diagram according to an exemplary embodiment of the present invention. In a single channel, the PR-based D/PLL may consist of a delay-locked loop (DLL) and a phase-locked loop (PLL). The PR-based D/PLL may comprise multiphase samplers (Input Samplers), a phase decision logic (Decision Logic), digital loop filters (DLF and ACC), two phase rotators (PR1 and PR2), and a plurality of phase interpolators (PIs). The "Multiphase Clock GEN" may generate the multiphase clock signals by converting a synchronized clock signals ($CLK_{REF}$) outputted from the VCO included in the PLL.

The DLL may be realized by including elements, the Input Samplers, the Decision Logic, the DLF, the PR2 and the PIs. The PLL may be realized by sharing the elements of the DLL excluding the PR2 and further including the ACC and the PR1.

Offset-free clock signal ($\phi_{PR,1}$) may be generated by the PR1 and transferred to the PR2 for the input phase tracking. The PR2 may replaces the power-hungry phase shifter in conventional D/PLL designs. These two separately controlled phase rotators (PR1 and PR2) as well as the multiphase clocking scheme decouples the jitter tracking from the jitter filtering capability of a PLL.

The PR2 may add a phase of the first clock signal, $\phi_{PR,1}$ to a phase of the second clock signal, $\phi_{PR,2}$ of which a phase is determined using the control code or subtract the phase of $\phi_{PR,1}$ from the phase of $\phi_{PR,2}$.

The phase of input data is tracked by the two loops, the DLL and the PLL. The phase of the sampling clock may be the following Equation 1

$$\phi_{IN}=\phi_{PR,1}+\phi_{PR,2}$$ [Equation 1]

wherein the '$\phi_{PR,2}$' may be controlled by a shared digital loop filter, DLF, and the '$\phi_{PR,1}$' may be controlled by a cascaded digital filter, such as a digital accumulator (ACC). The transfer function of the ACC may include a pole and a zero, and the zero may limit the phase difference between $\phi_{PR,1}$ and $\phi_{PR,2}$. The $\phi_{PR,1}$ may have no frequency offset compared to the input data due to the second order loop. The ACC and the PR1 may be replaced by the VCO with a proportional control path. The retiming clock signal, $\phi_{PR,1}$, is provided to the multiplexer for the data transmission. Since the jitter tracking bandwidth of $\phi_{PR,1}$ is made narrow, the amount of jitter at the transmitted data is reduced substantially compared to that of the input data. The phase difference between $\phi_{PR,1}$ and $\phi_{PR,2}$ is not problematic since the input data is demultiplexed and thus $\phi_{PR,1}$ has an expanded sampling window. This jitter reduction scheme is identical to that of a conventional SerDes based schemes but the RX and TX PLLs are combined together.

Figure 3:
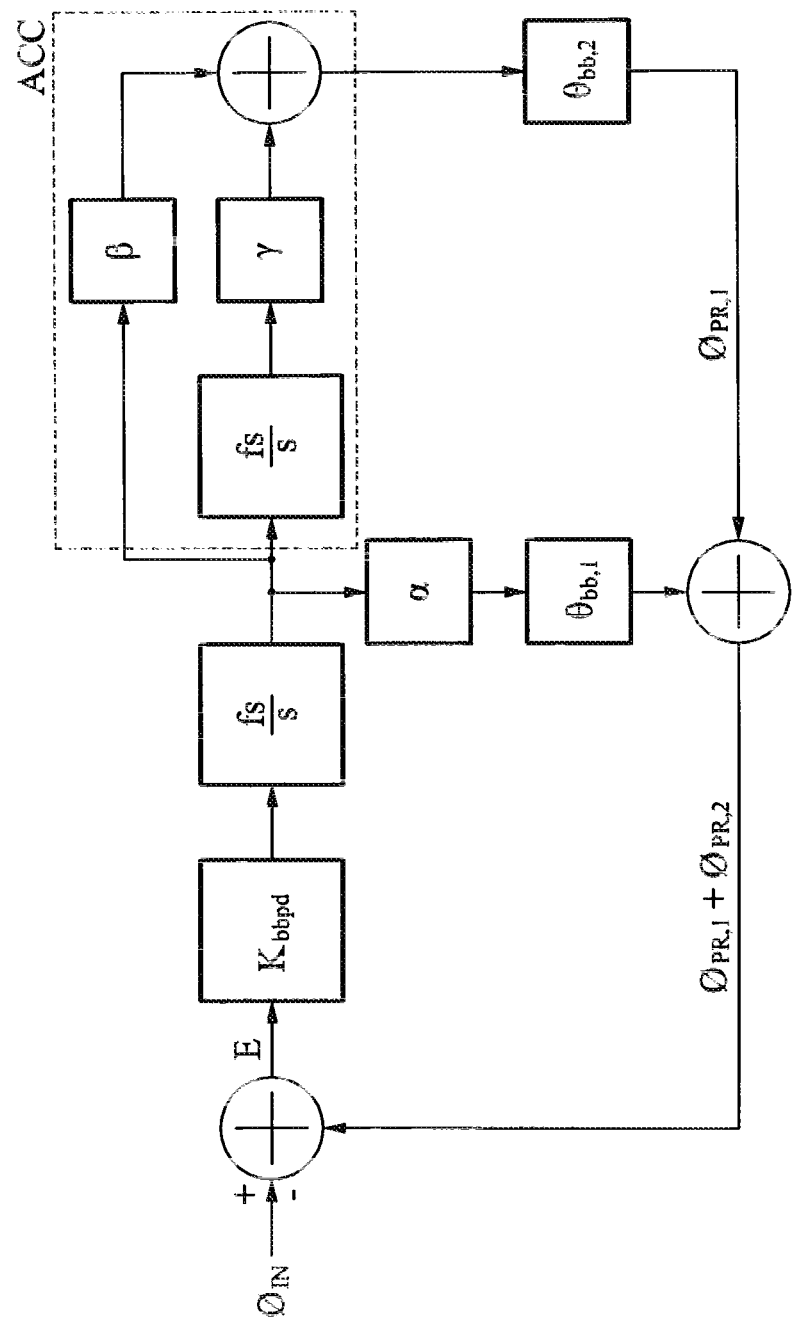
FIG. 3 shows the linearized mathematical model of the PR-based D/PLL architecture according to an exemplary embodiment of the present invention.

FIG. 3 shows the linearized mathematical model of the PR-based D/PLL architecture according to an exemplary embodiment of the present invention. A linearized gain of a Bang-bang phase detector, $K_{bbpd}$, may be achieved by using a Markov chain model. For example, the Bang-bang phase detector may comprise the multiphase samplers (Input Samplers) and the phase decision logic (Decision Logic). The jitter transfer and tolerance function of the proposed system may be derived as following from Equation 2 to Equation 4.

$$\frac{\phi_{PR,1}(s)}{\phi_{IN}(s)} = \frac{K_{bbpd} \cdot f_s \cdot \alpha \cdot \theta_{bb,1}(\beta s + f_s \cdot \gamma)}{s^2 + K_{bbpd} \cdot f_s \cdot (\theta_{bb,2} + \beta \cdot \alpha \cdot \theta_{bb,1})s + K_{bbpd} \cdot f_s \cdot f_s \cdot \gamma \cdot \theta_{bb,1}}$$ [Equation 2]

$$\frac{\phi_{PR,1}(s) + \phi_{PR,2}(s)}{\phi_{IN}(s)} =$$ [Equation 3]
$$\frac{K_{bbpd} \cdot f_s \{s(\theta_{bb,2} + \beta \cdot \alpha \cdot \theta_{bb,1}) + f_s \cdot \gamma \cdot \alpha \cdot \theta_{bb,1}\}}{s^2 + K_{bbpd} \cdot f_s \cdot (\theta_{bb,2} + \beta \cdot \alpha \cdot \theta_{bb,1})s + K_{bbpd} \cdot f_s \cdot f_s \cdot \gamma \cdot \theta_{bb,1}}$$

$$\frac{E(s)}{\phi_{IN}(s)} = \frac{s^2}{s^2 + K_{bbpd} \cdot f_s \cdot (\theta_{bb,2} + \beta \cdot \alpha \cdot \theta_{bb,1})s + K_{bbpd} \cdot f_s \cdot f_s \cdot \gamma \cdot \theta_{bb,1}}$$ [Equation 4]

wherein '$f_s$', '$\alpha \cdot \theta_{bb,1}$', '$\beta$' and '$\gamma \cdot \theta_{bb,1}$' may denote a sampling late of the ACC, a gain of the PR1, a proportional gain of the ACC and a low-frequency gain of the PR2.

Figure 4:
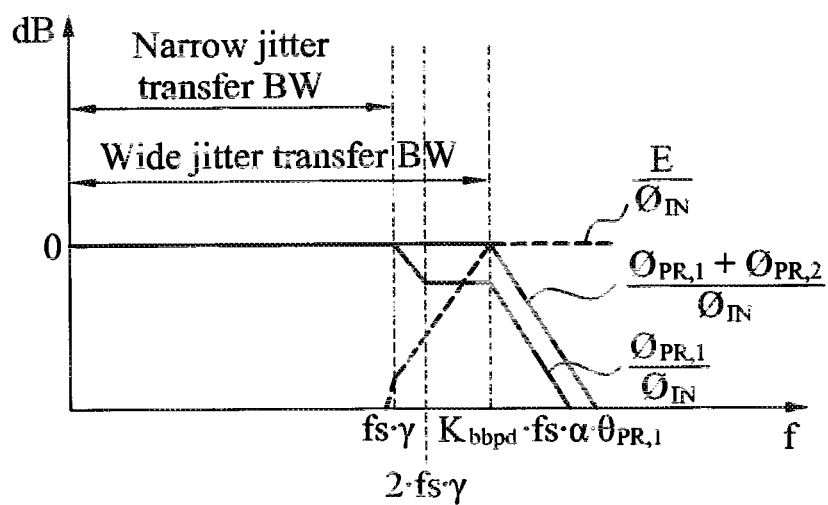
FIG. 4 shows a conceptual bode plot of the transfer functions according to an exemplary embodiment of the present invention.

FIG. 4 shows a conceptual bode plot of the transfer functions according to an exemplary embodiment of the present invention. Jitter transfer bandwidth is decoupled from that of the jitter tolerance. Peaking in jitter transfer can be made negligible easily by adjusting design parameters.

Figure 5:
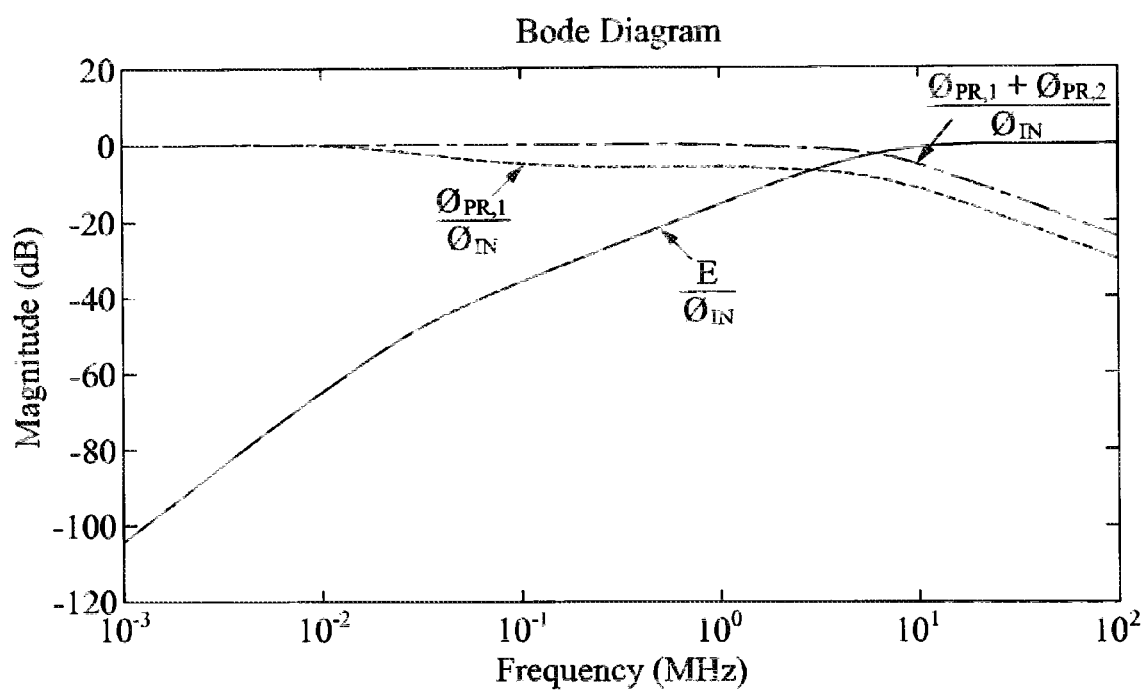
FIG. 5 shows matlab-simulated bode plots of the transfer functions according to an exemplary embodiment of the present invention.

FIG. 5 shows matlab-simulated bode plots of the transfer functions according to an exemplary embodiment of the present invention. The matlab-simulated bode plots show that the PR-based D/PLL has narrow jitter transfer bandwidth and wide jitter tracking bandwidth simultaneously.

Figure 6:
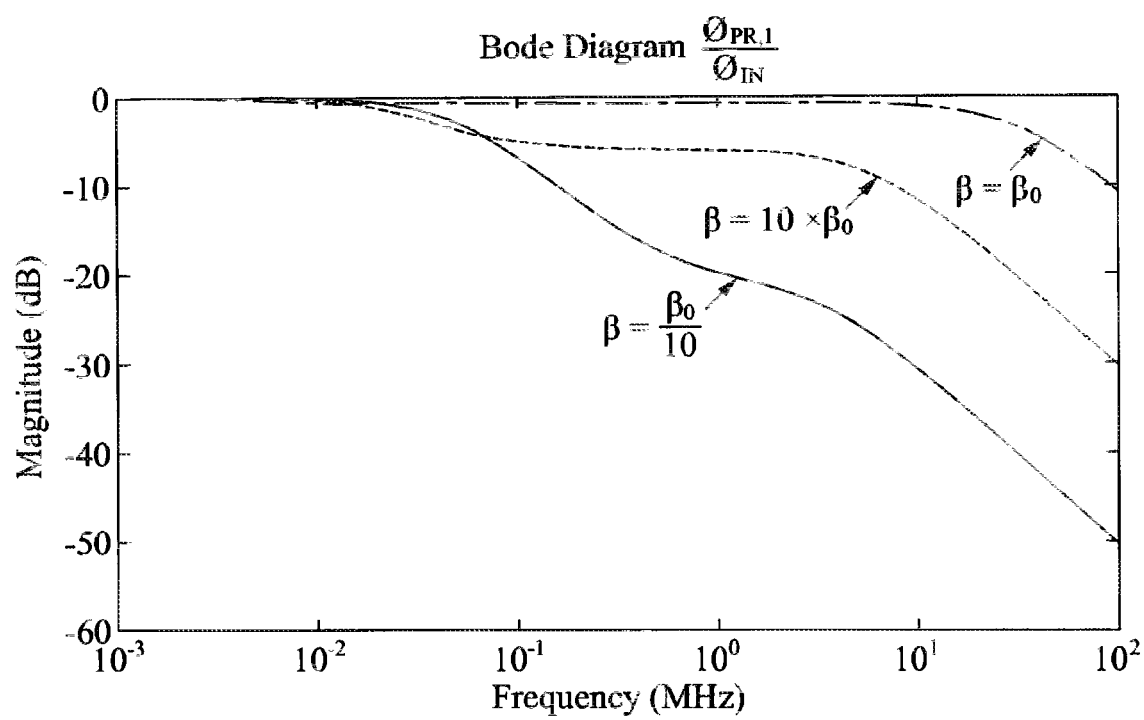
FIG. 6 validates the design concept according to an exemplary embodiment of the present invention.

FIG. 6 validates the design concept according to an exemplary embodiment of the present invention. The design concept shows that the jitter transfer bandwidth may be more narrow by decreasing a gain of the PR2

In this architecture, the multiphase clocking significantly reduces the power consumption of the PR-based D/PLL by replacing line-rate delay elements with a phase rotator, for example, the PR1 shown above FIG. 2. Because the input data is sampled with a multiphase clock signal, the output of the sampler is inherently demultiplexed. The demultiplexed signal is then serialized with a much cleaner clock signal. A large demultiplexing factor increases the timing margin in the multiplexer and enables the reduction in the jitter transfer bandwidth.

Figure 7:
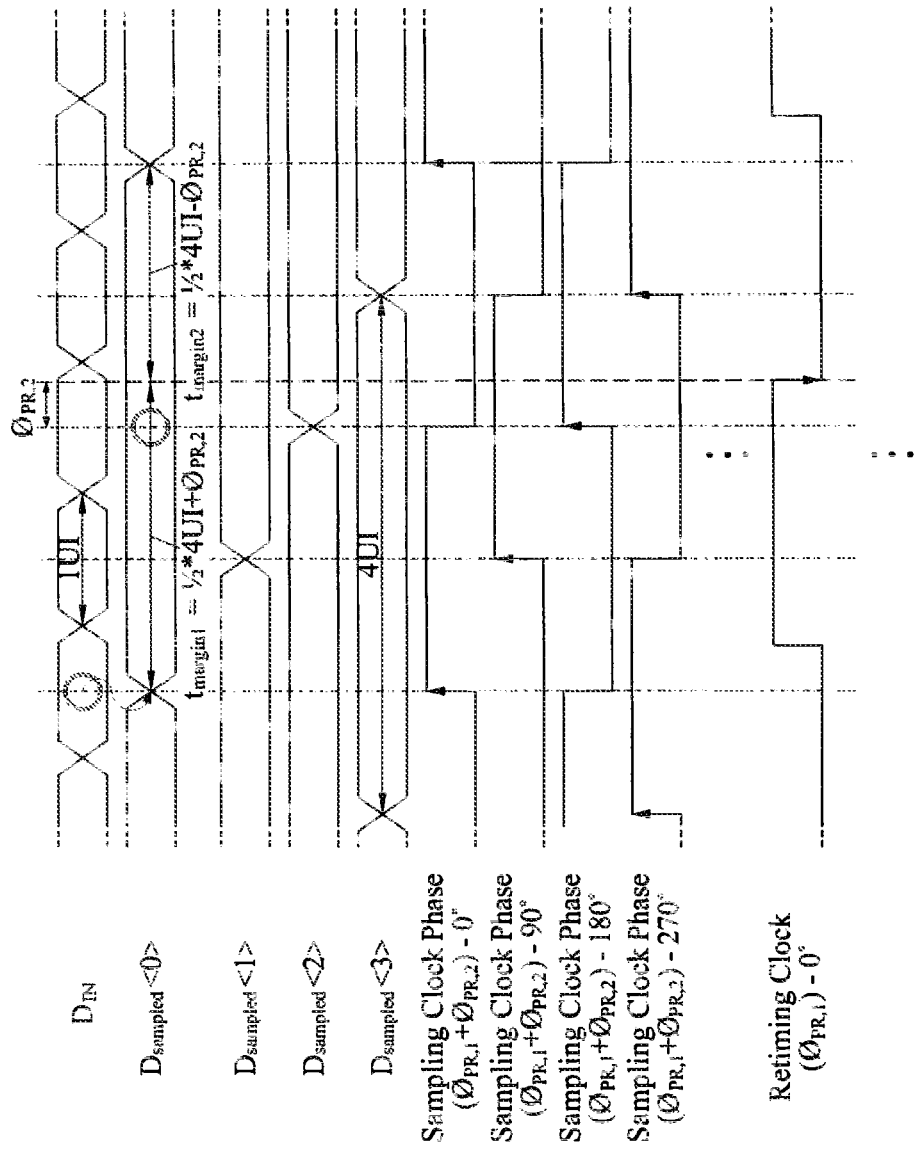
FIG. 7 shows the timing diagram of a 1:4 demultiplexer based the PR-based D/PLL for lagging clock phase according to an exemplary embodiment of the present invention.
Figure 8:
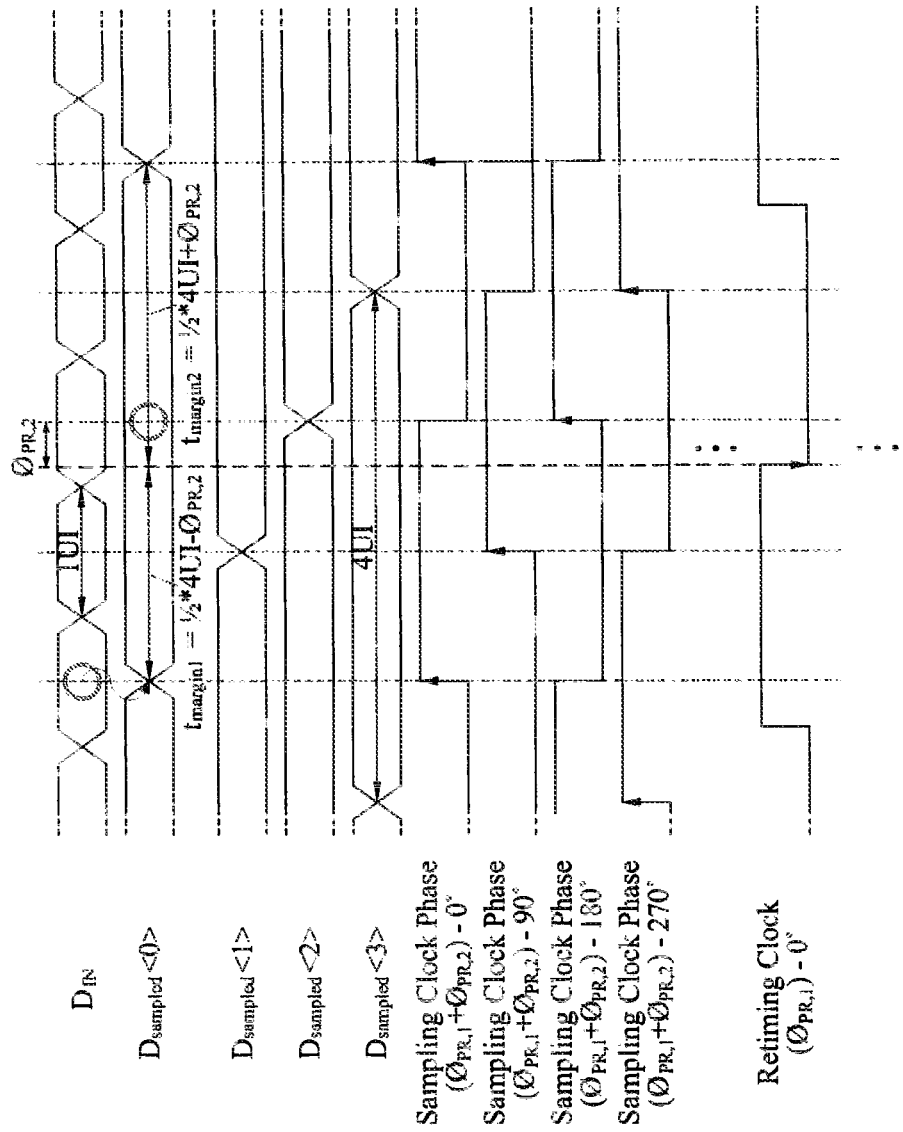
FIG. 8 shows the timing diagram of a 1:4 demultiplexer based the PR-based D/PLL for leading clock phase according to an exemplary embodiment of the present invention.

FIG. 7 shows the timing diagram of a 1:4 demultiplexer based the PR-based D/PLL for lagging clock phase according to an exemplary embodiment of the present invention. And, FIG. 8 shows the liming diagram of a 1:4 demultiplexer based the PR-based D/PLL for leading clock phase according to an exemplary embodiment of the present invention. The utilization of the multiphase clocking scheme with the multiplexing ratio of M relaxes the timing constraints to $$\frac{1UI \times M}{2} - \phi_{PR,1}.$$

The proposed scheme efficiently achieves separated jitter transfer and tolerance bandwidth by using a single PLL loop without significant power penalty unlike conventional DPLL. It is because a phase rotator consumes much less power compared to a phase shifter in the data path because the phase rotator operates in the clock domain and a large amount of phase shifting can be achieved without hardware increment.

The exemplary embodiments according to the present invention may be recorded in computer-readable media including program instructions to implement various operations embodied by a computer. The media may also include, alone or in combination with the program instructions, data files, data structures, and the like. The media and program instructions may be those specially designed and constructed for the purposes of the present invention, or they may be of the kind well-known and available to those having skill in the computer software arts.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A transceiver comprising:
    a phase rotator (PR)-based delay-locked loop and phase-locked loop (D/PLL) unit configured to generate demultiplexed data samples for input data using multiphase clock signals for sampling the input data and a reference clock signal; and
    a multiplexer configured to serialize the demultiplexed data samples,
    wherein the multiphase clock signals are generated using a first clock signal, for retiming the sampled input data, controlled by the phase-locked loop (PLL) and a second clock signal controlled by the delay-locked loop (DLL),
    wherein, for the DLL, the PR-based D/PLL unit comprising:
        a plurality of input samplers configured to generate the demultiplexed data samples by time-interleaving using the input data and the multiphase clock signals;
        a control code generating unit configured to generate a control code for controlling a phase of the second clock signal;
        a first phase rotator configured to add a phase of the first clock signal to a phase of the second clock signal of which a phase is determined using the control code or subtract the phase of the first clock signal from the phase of the second clock signal; and
        a plurality of phase interpolators (PIs) configured to generate the multiphase clock signals using an output of the first phase rotator.

2. The transceiver of claim 1, wherein, for the PLL, the PR-based D/PLL unit further comprises:
    a digital accumulator (ACC) configured to limit a phase difference between the first clock signal and the second clock signal; and
    a second phase rotator configured to generate the first clock signal of which a phase is shifted using a clock signal outputted from the ACC and the reference clock signal from a frequency-locked loop (FLL).

3. A phase rotator (PR)-based delay-locked loop and phase-locked loop (D/PLL) apparatus comprising:
    a plurality of input samplers configured to generate demultiplexed data samples by time-interleaving using a input data and multiphase clock signals generated for sampling the input data based on a first clock signal and a second clock signal;
    a control code generating unit configured to generate a control code for controlling a phase of the second clock signal;
    a first phase rotator configured to add a phase of the first clock signal to a phase of the second clock signal of which a phase is determined using the control code or subtract the phase of the first clock signal from the phase of the second clock signal;
    a plurality of phase interpolators (PIs) configured to generate the multiphase clock signals using an output of the first phase rotator;
    a digital accumulator (ACC) configured to limit a phase difference between the first clock signal and the second clock signal; and
    a second phase rotator configured to generate the first clock signal of which a phase is shifted using a clock signal outputted from the ACC and the reference clock signal from a frequency-locked loop (FLL).

* * * * *